US011304327B2

(12) United States Patent
Hung et al.

(10) Patent No.: US 11,304,327 B2
(45) Date of Patent: Apr. 12, 2022

(54) SYSTEM AND METHOD FOR MECHANICAL RELEASE OF SLEDS IN ENCLOSURES

(71) Applicant: DELL PRODUCTS, LP, Round Rock, TX (US)

(72) Inventors: Hsiang-Yin Hung, Taipei (TW); Chi-Feng Lee, Taipei (TW); Raymond D. Heistand, II, Round Rock, TX (US)

(73) Assignee: Dell Products L.P., Round, TX (US)

( * ) Notice: Subject to any disclaimer, the term of this patent is extended or adjusted under 35 U.S.C. 154(b) by 375 days.

(21) Appl. No.: 16/275,931

(22) Filed: Feb. 14, 2019

(65) Prior Publication Data

US 2020/0267869 A1 Aug. 20, 2020

(51) Int. Cl.
*H05K 7/14* (2006.01)
*H05K 7/20* (2006.01)
*H05K 5/02* (2006.01)

(52) U.S. Cl.
CPC ........... *H05K 7/1488* (2013.01); *H05K 5/023* (2013.01); *H05K 5/0221* (2013.01); *H05K 7/1421* (2013.01); *H05K 7/20709* (2013.01)

(58) Field of Classification Search
CPC ...................................................... H05K 7/18
See application file for complete search history.

(56) References Cited

U.S. PATENT DOCUMENTS

| 9,788,451 B2 | 10/2017 | Bailey et al. |
| 10,010,008 B2 | 6/2018 | Hughes et al. |
| 2013/0130528 A1* | 5/2013 | Jun ...................... H05K 7/1409 439/160 |
| 2015/0181748 A1* | 6/2015 | Bailey .................. H05K 7/1488 361/679.58 |
| 2016/0351359 A1* | 12/2016 | Sampath .................. G05G 1/54 |
| 2017/0071071 A1 | 3/2017 | Tseng et al. |
| 2018/0160563 A1 | 6/2018 | Hung et al. |

* cited by examiner

*Primary Examiner* — Jerry Wu
(74) *Attorney, Agent, or Firm* — Larson Newman, LLP

(57) ABSTRACT

An enclosure for installation in a server rack has front panel access to multiple release mechanisms. The front panel access allows separate and safe dual tasking of both hot and cold swaps. A hot swap mechanism allows a sled to be ejected while retaining a connection to electrical power. A separate cold swap mechanism releases the sled and also disconnects the electrical connection. When the hot swap mechanism is engaged or enabled, one or more mechanical linkages operate to lock out access to the cold swap mechanism. When the cold swap mechanism is engaged or enabled, the mechanical linkages interferes or blocks manual operation of the hot swap mechanism. Both the hot swap mechanism and the cold swap mechanism thus cannot be inadvertently and/or simultaneously performed.

20 Claims, 20 Drawing Sheets

SYSTEM AND METHOD FOR MECHANICAL RELEASE OF SLEDS IN ENCLOSURES

FIELD OF THE DISCLOSURE

The present disclosure generally relates to information handling systems, and more particularly relates to the mechanical release of a sled in an enclosure for a server rack.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A sled for installation in a server enclosure has front panel access to multiple release mechanisms. The front panel access allows separate and safe dual tasking of both hot and cold swaps. A hot swap mechanism allows the sled to be ejected while still retaining an electrical connection to electrical power. A separate cold swap mechanism releases the sled and also disconnects the electrical connection. When the hot swap mechanism is engaged or enabled, one or more mechanical linkages operate to lock out an access to the cold swap mechanism. When the cold swap mechanism is engaged or enabled, the mechanical linkages interfere or block manual operation of the hot swap mechanism. The hot swap mechanism and the cold swap mechanism cannot be inadvertently simultaneously performed.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
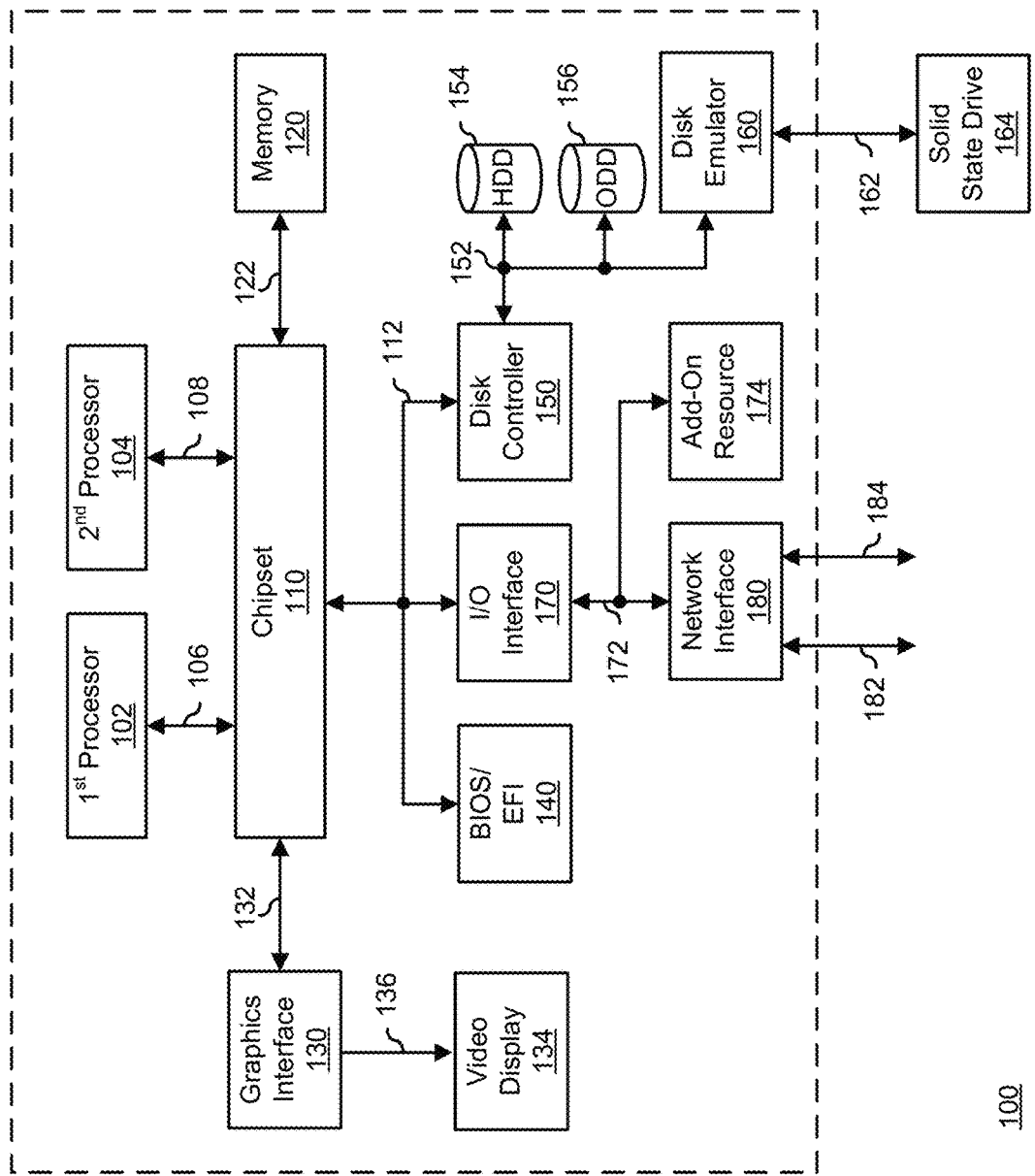
FIG. 1 is a block diagram illustrating an information handling system according to an embodiment of the present disclosure.

FIG. 1 illustrates a generalized embodiment of information handling system 100. Information handling system 100 has processors 102 and 104, a chipset 110, a memory 120, a graphics interface 130, a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
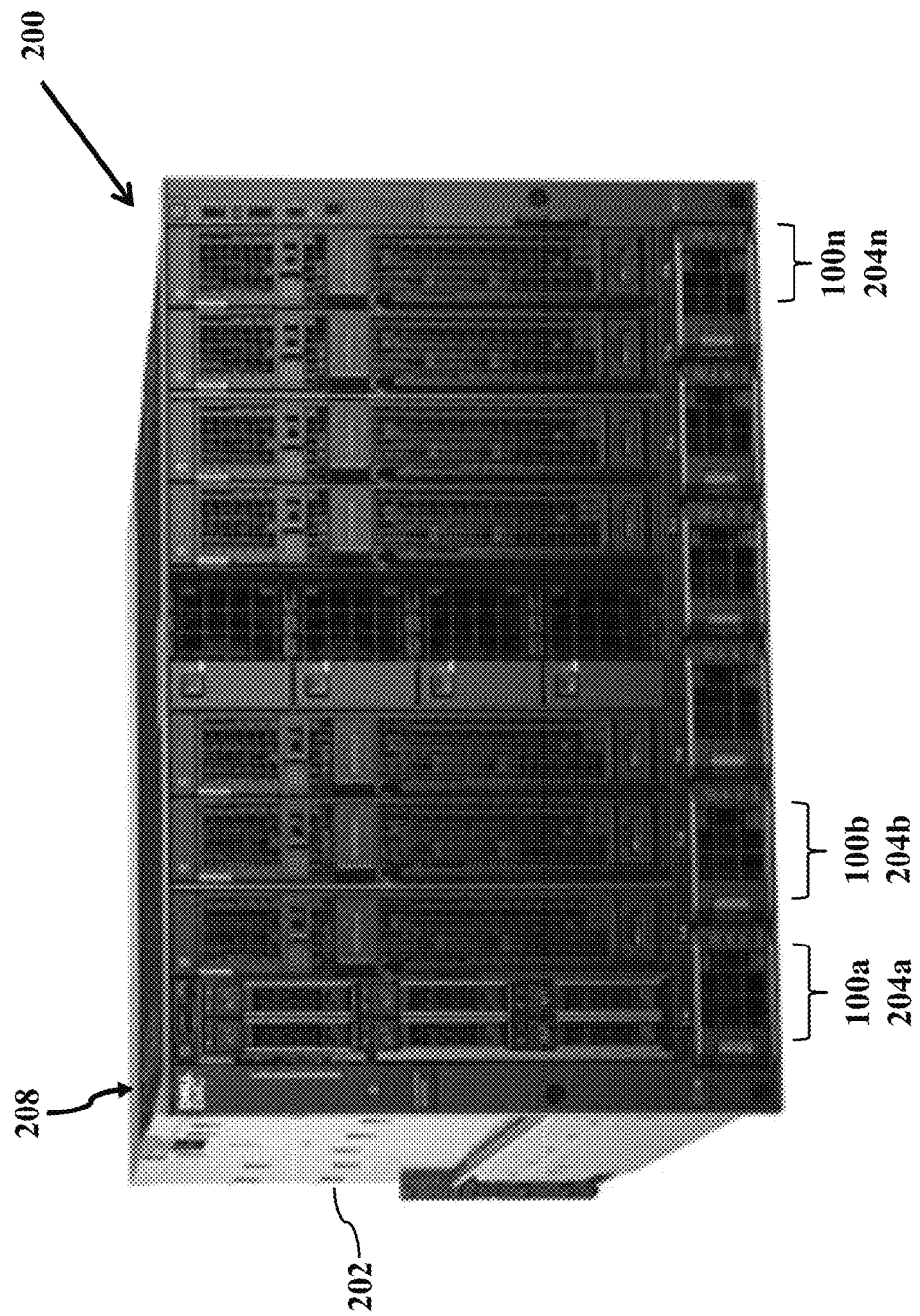
FIG. 2 is a perspective view of an enclosure for multiple information handling systems, according to exemplary embodiments.
Figure 3:
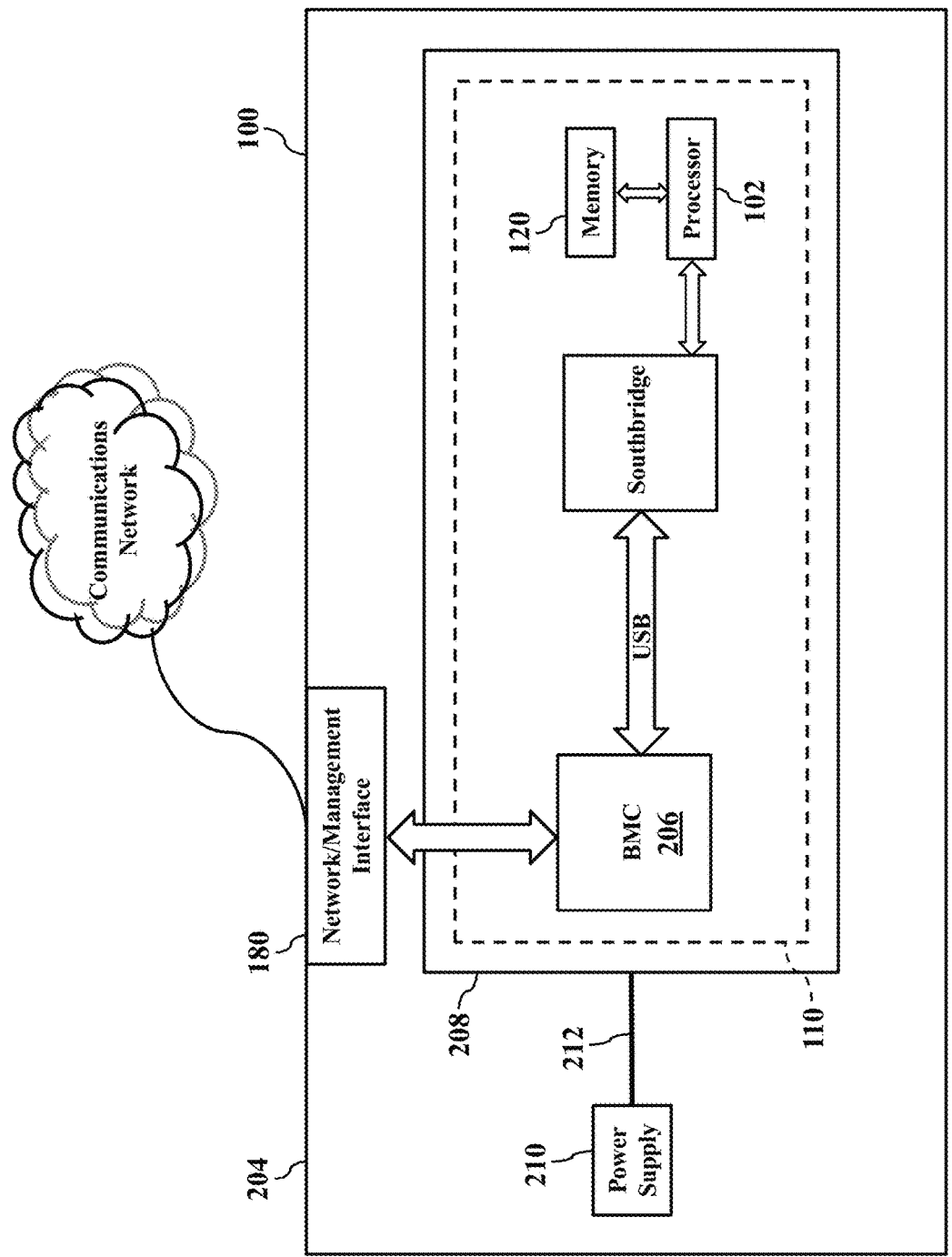
FIG. 3 is a block diagram of a sled that may be inserted into and removed from the enclosure, according to exemplary embodiments.

FIG. 2 shows an enclosure 200 for a server rack. The enclosure 200 has an outer sheet metal chassis 202 that internally houses or contains multiple information handling systems such as computing or storage blades or sleds 204. As FIG. 3 shows, each individual sled 204 may have its own corresponding baseboard management controller 206 (such as the processor 102 and the memory 120) and interface 180 to a communications network. Each sled 204 has a physical/electrical connection to a power supply 210, so that the sled 204 receives electrical power 212 for the baseboard management controller 206 and the network interface 180. Because the enclosure 200 may have many bays for individual or separate sleds 204a-n, the enclosure 200 may have one or more chassis management controllers 208 installed and operating within the chassis 202. The individual sleds 204 communicate with the chassis management controller 208 (perhaps via I/O interfaces, such as ISA, SCSI, I²C, SPI, and/or USB).

Figure 4:
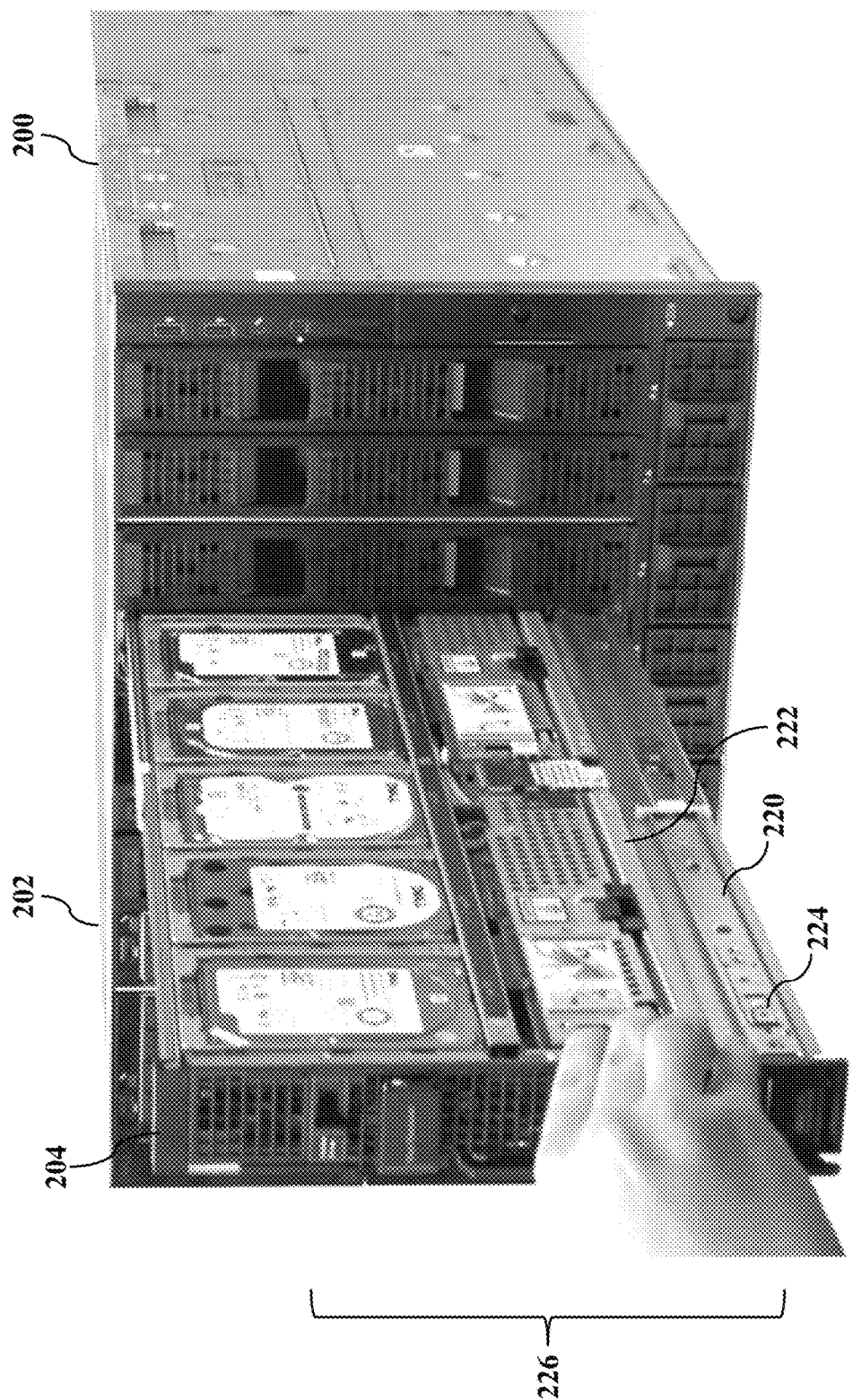
FIG. 4 illustrates a removal of an individual sled, according to exemplary embodiments.

FIG. 4 shows the removal of the sled 204, according to exemplary embodiments. When a user wishes to access and/or to replace the sled 204, the user outwardly pulls it from stowage within the chassis 202. That is, the sled 204 is mounted or attached to a slider mechanism 220. The slider mechanism 220 has a drive drawer 222 mounted or affixed to extendable sliders 224. When the user successfully operates a release mechanism 226, the release mechanism 226 releases or unlocks the slider mechanism 220 and at least partially ejects the sled 204 from within a bay 223 of the chassis 202. The user may then grasp and pull the drive drawer 222, thus fully extending the telescopic sliders 224 from within the chassis 202. Once the sliders 224 are nearly fully extended (perhaps to their full length), the user may thus access and/or replace the components of the sled 204. As a common example, the user may replace or "hot-swap" storage drives 225 or other components within the sled 204. When the user is finished servicing the sled 204, the user may push the sled 204 back into the bay 223 of the chassis 202, thus compressing or shortening the sliders 224. Once the drive drawer 222 is fully inserted back into the chassis 202, the release mechanism 226 re-engages and locks or retains the drive drawer 222 within the chassis 202.

Figure 5:
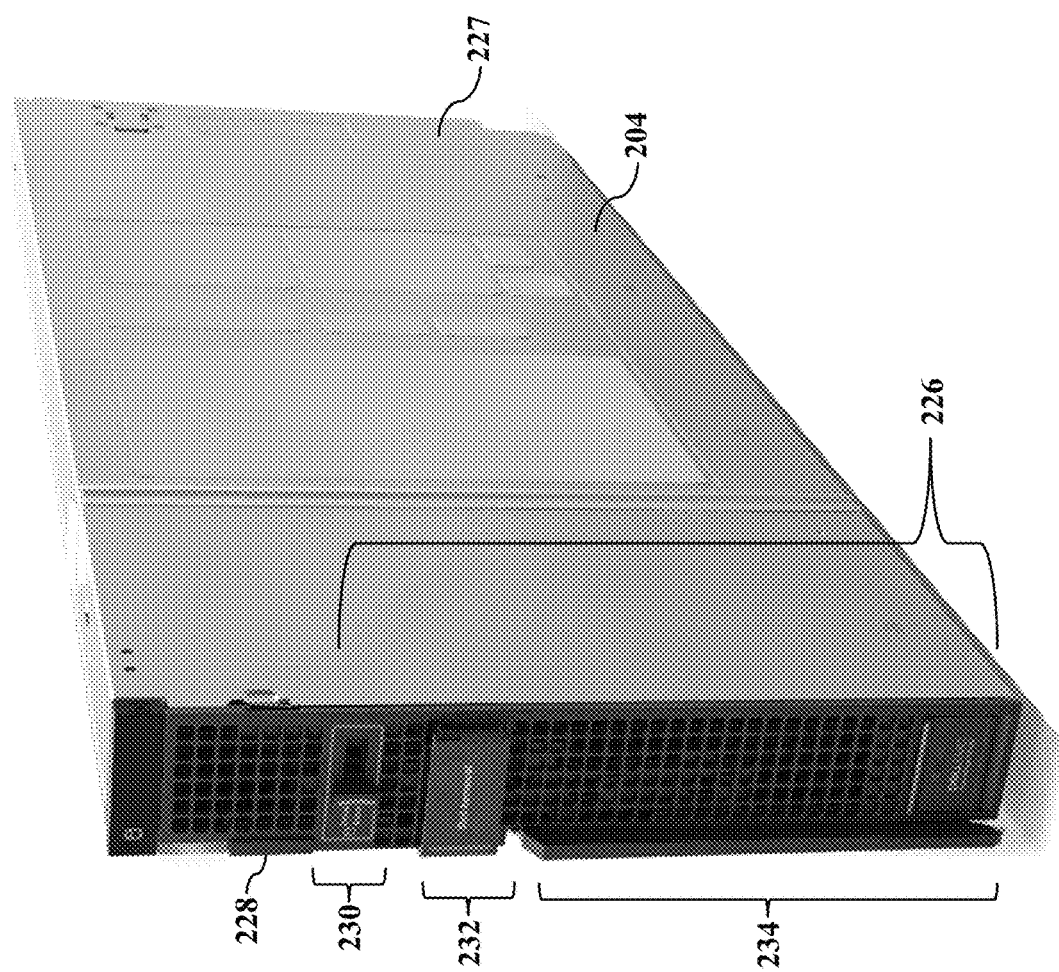
FIGS. 5-6 are perspective views of the sled, according to exemplary embodiments.
Figure 6:
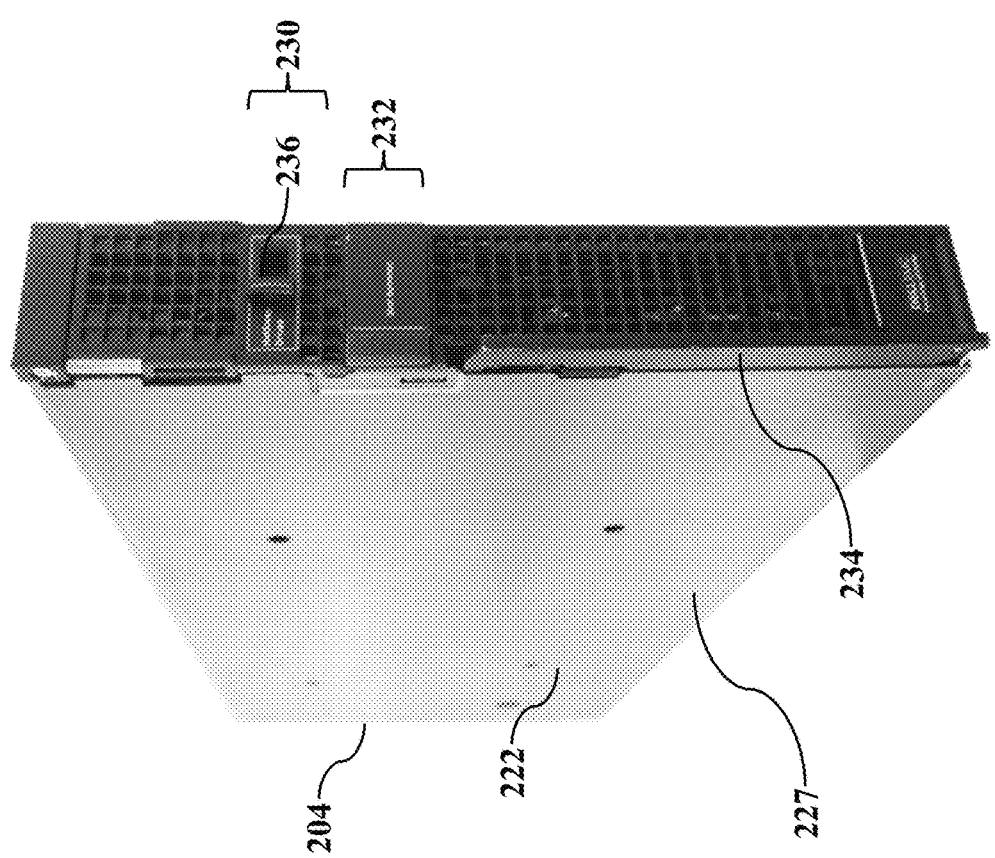

FIG. 5 shows that when the sled 204 is fully inserted into the chassis 202, the sled 204 inserts within an outer sleeve 227. The outer sleeve 227, in other words, may be stationary and selectively releasable from inside the chassis 202 (illustrated in FIGS. 2 and 4). Although not shown, the sled 204 and the outer sleeve 227 may be selectively mounted to the slider mechanism 220 (illustrated in FIG. 4) for insertion into, and retraction from, the outer sleeve 227. The sled 204 has a front panel 228 that is both visually and physically accessible during operation. That is, the front panel 228 of the sled 204 is always accessible, whether or not the sled 204 is installed in the drive drawer 222 (illustrated in FIG. 4) and whether or not the sled 204 is inserted within, or outwardly extending from, the chassis 202.

Because the front panel 228 is always accessible, the release mechanism 226 is configured for dual tasking of both hot and cold swaps. That is, the release mechanism 226 has a hot swap mechanism 230 and a cold swap mechanism 232. The hot swap mechanism 230 and the cold swap mechanism 232 are both accessible from the front panel 228 of the sled 204. The hot swap mechanism 230 allows the sled 204 to be ejected from within the outer sleeve 227, but the hot swap mechanism 230 still retains a physical connection to the electrical power 212 (illustrated in FIG. 3). The cold swap mechanism 232 may eject both the sled 204 and the outer sleeve 227 from within the chassis 202, but the cold swap mechanism 232 also cuts or disconnects the physical connection to the electrical power 212. The hot swap mechanism 230, in other words, slides the drive drawer 222 (illustrated in FIG. 4) out of the outer sleeve 227 to expose internal componentry (such as the storage drives 225 illustrated in FIG. 4), yet the sled 204 remains powered on through the connection to the 7U infrastructure. The drive drawer 222 may be operated while the sled 204 is running. The cold swap mechanism 232, however, requires that the sled 204 be shut down before the physical disconnection from the chassis infrastructure.

The release mechanism 226 thus automatically performs enablement and disablement. For example, when the user wishes to perform a hot swap task, the user selectively enables the hot swap mechanism 230. When the hot swap mechanism 230 is manually enabled, the release mechanism 226 automatically and mechanically disengages the cold swap mechanism 232. The release mechanism 226 thus prevents deployment or movement of a sled handle 234, which is required to completely release and remove the sled 204 and the outer sleeve 227 from the chassis 202 shown in FIG. 4. The cold swap mechanism 232, in other words, is automatically and mechanically disabled to prevent invalid sled handle ejection during hot swap tasks.

The release mechanism 226 may also automatically disable the hot swap mechanism 230. When the user wishes to perform a cold swap task, the user selectively enables the cold swap mechanism 232. Once the cold swap mechanism 232 is manually enabled, the release mechanism 226 automatically and mechanically disengages the hot swap mechanism 230. So, when the sled handle 234 is released for cold swap sled removal, the hot swap mechanism 230 for hot swap drive drawer is disabled to prevent the drive drawer 222 from accidentally sliding out of the protective outer sleeve 227 during transportation.

The release mechanism 226 satisfies many design issues. While the performance and density of a server increases year over year, the available space for any hardware mechanism becomes more challenging. The release mechanism 226 may thus be used on space-limited operation that follows customized logic to enable and disable the release mechanisms 230 and 232. The release mechanism 226 has an intuitive front interface design (via the front panel 228) that reduces cognitive load and the amount of learning needed to perform the tasks, simplifies and smoothens the steps required for the tasks, and helps prevent human errors.

The release mechanism 226 improves upon conventional schemes. The release mechanism 226 of both the hard drive drawer 222 and the outer sleeve 227 are both placed on the front panel 228 or bezel of the sled 204. Both the hot swap mechanism 230 and the cold swap mechanism 232 move along with the drive drawer 222 when slid in and out. The release mechanism 226 also satisfies thermal challenges, in that thermal requirements permit only a limited space on front panel 228 to be used for the release mechanism 226.

The release mechanism 226 also satisfies any usability issue. For example, the hot swap mechanism 230 and the cold swap mechanism 232 are intuitive and strongly associated with the operations. The hot swap mechanism 230 and the cold swap mechanism 232 are fool-proof and prevent mis-operation that leads to data loss or accidents. That is, the cold swap mechanism 232 provides additional protection to prevent it from being readily opened. Moreover, the hot swap mechanism 230 and the cold swap mechanism 232 cannot be simultaneously activated at the same time. The release mechanism 226 thus has an intuitive front interface design that reduces cognitive load and the amount of learning needed to perform the tasks, that simplifies and smoothens the steps required for the tasks, and that prevents the human errors.

Figure 7:
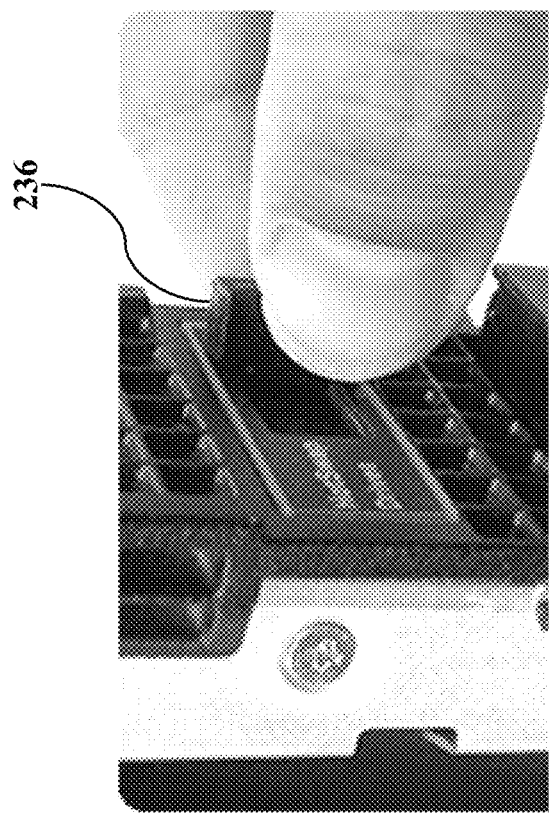
FIGS. 7-14 illustrate a hot swap task, according to exemplary embodiments.
Figure 8:
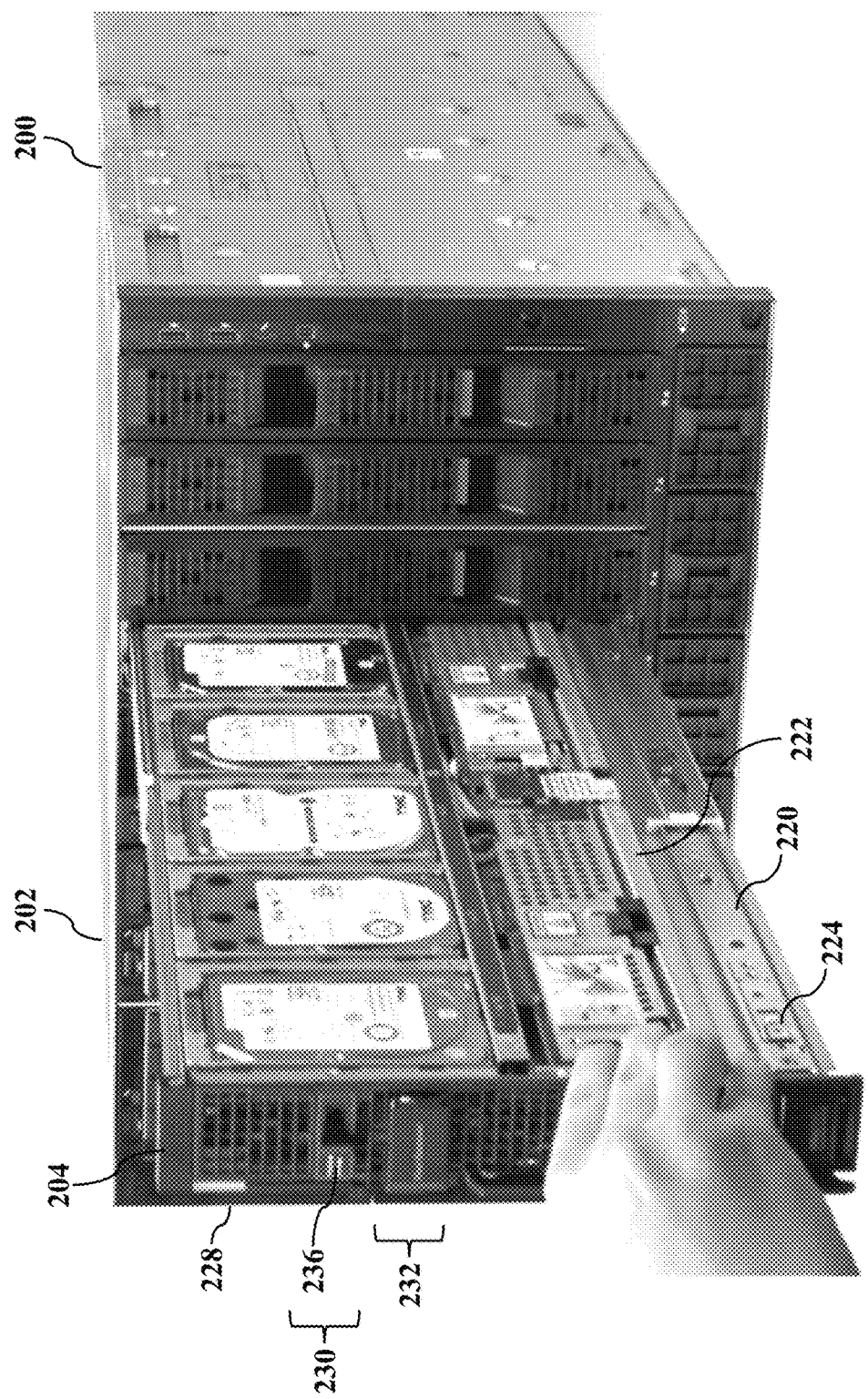

FIGS. 6-14 show that when the user wishes to perform the hot swap task, such as replacing or "hot swapping" a storage drive or other component, the user manually enables the hot swap mechanism 230. As FIG. 7 shows, the user manually grasps a release tab 236 of the hot swap mechanism 230. The release tab 236 protrudes through the front panel 228. The user slides or moves the release tab 236 to a position that enables the hot swap mechanism 230. As FIG. 8 illustrates, once the hot swap mechanism 230 is enabled, in response the hot swap mechanism 230 ejects the drive drawer 222 from within the outer sleeve 227. The user may thus pull and extend drive drawer 222 (via the slider mechanism 220) for servicing, and the sled 204 remains up and running.

Figure 9:
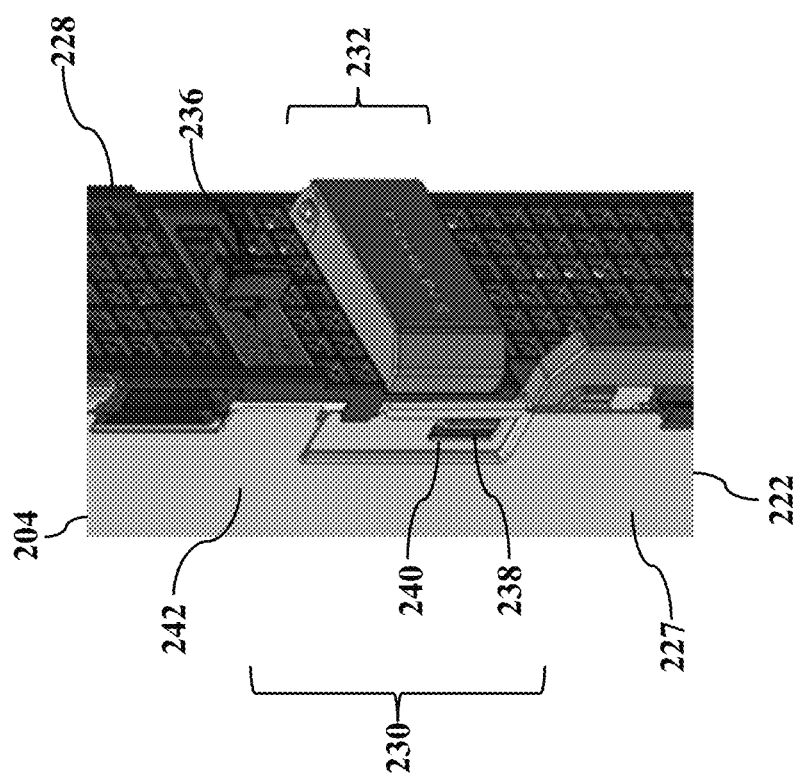
Figure 10:
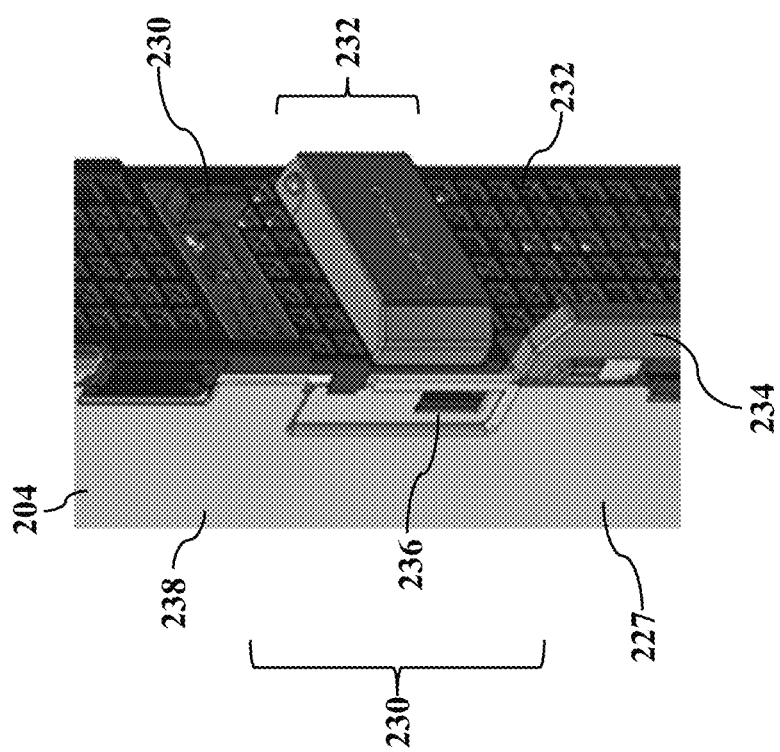
Figure 11:
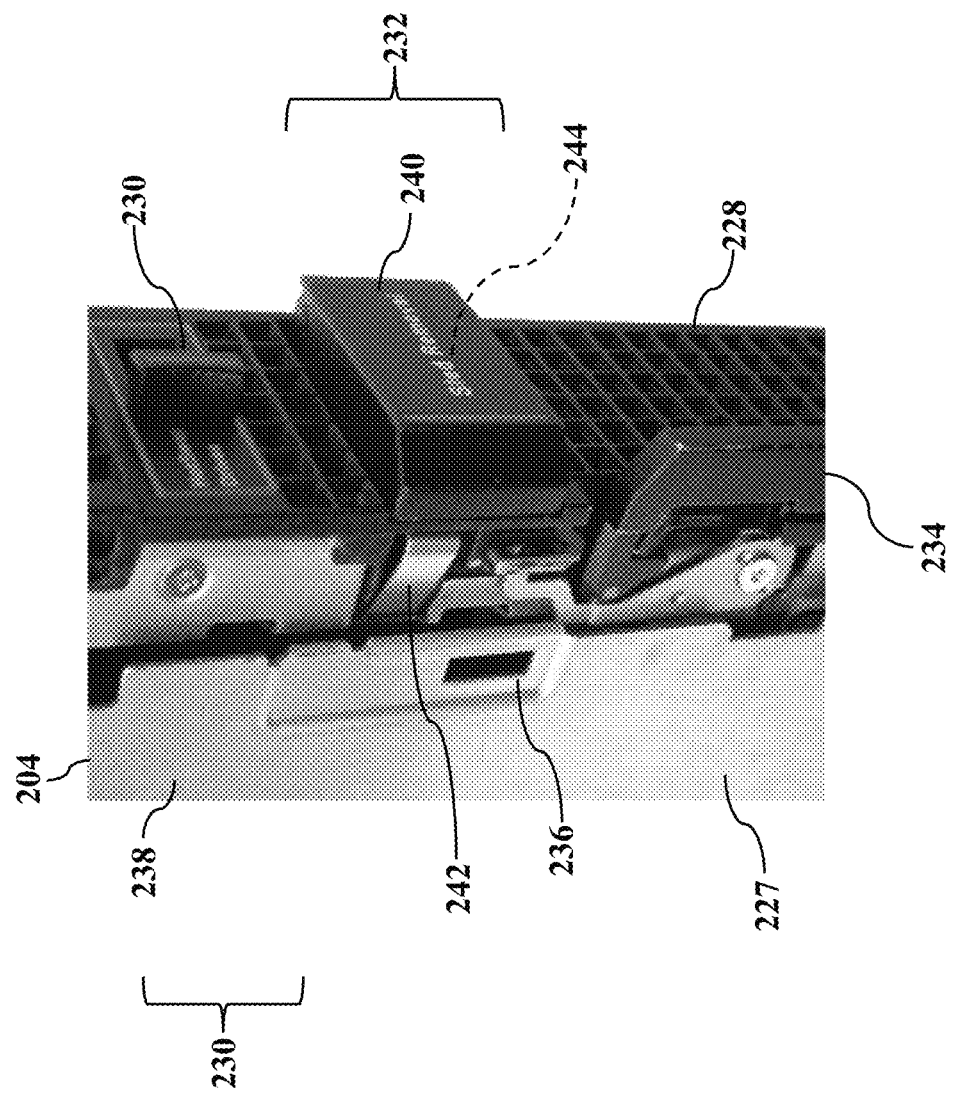
Figure 12:
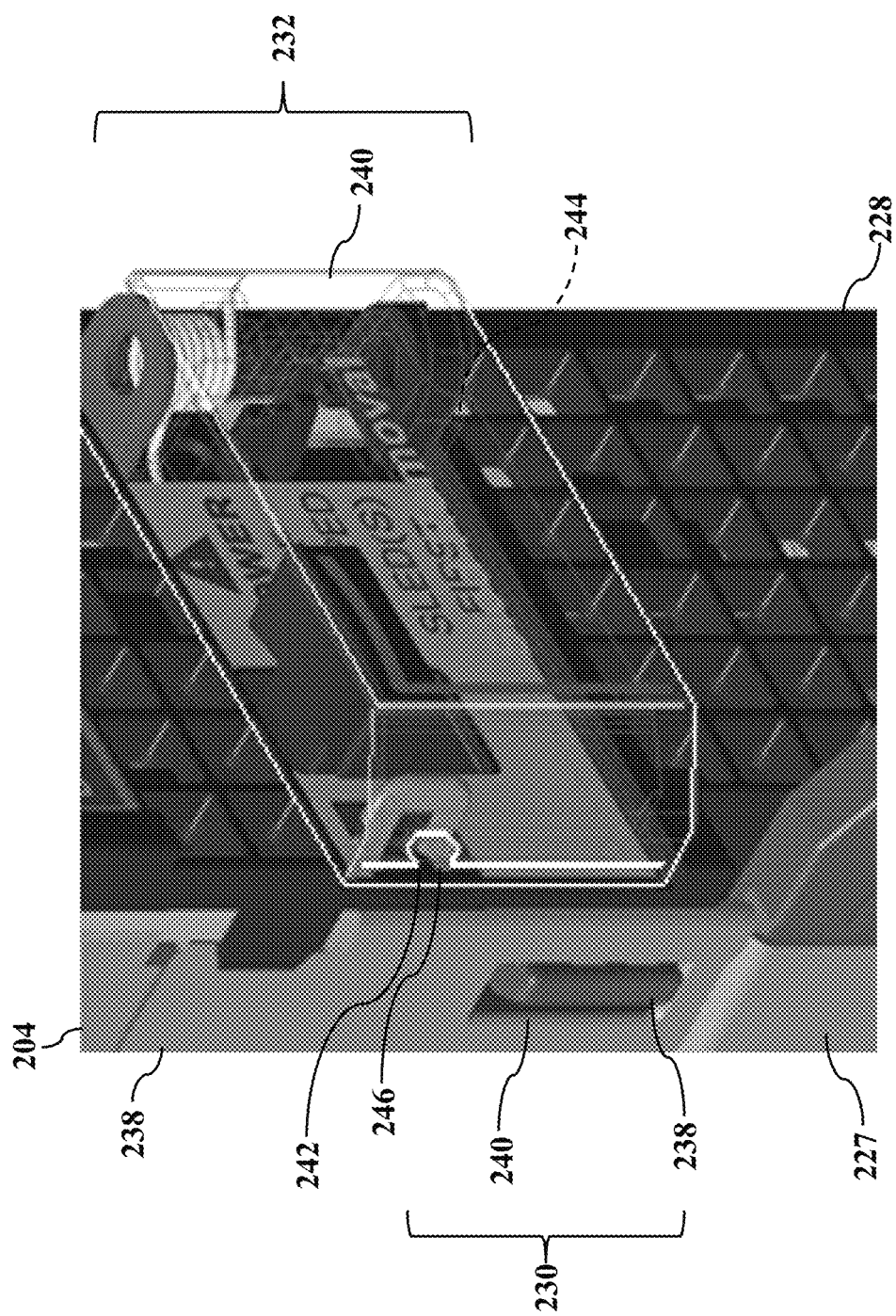
Figure 13:
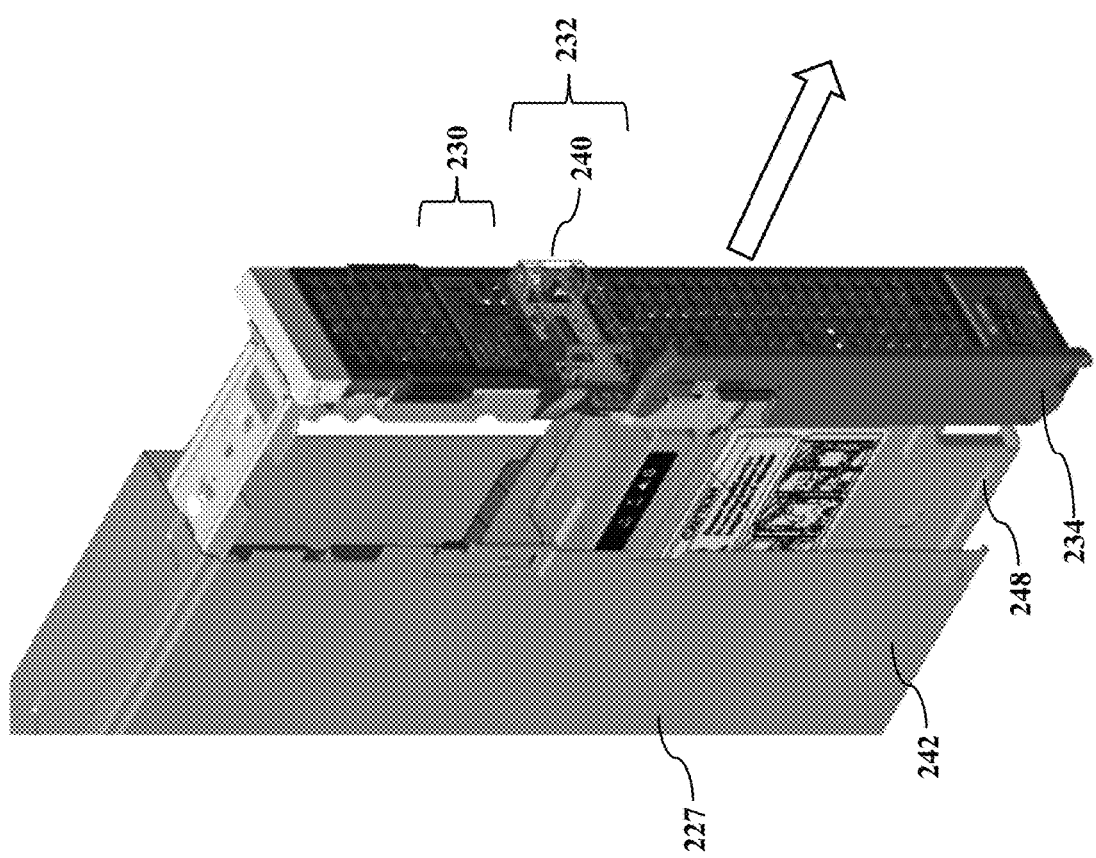
Figure 14:
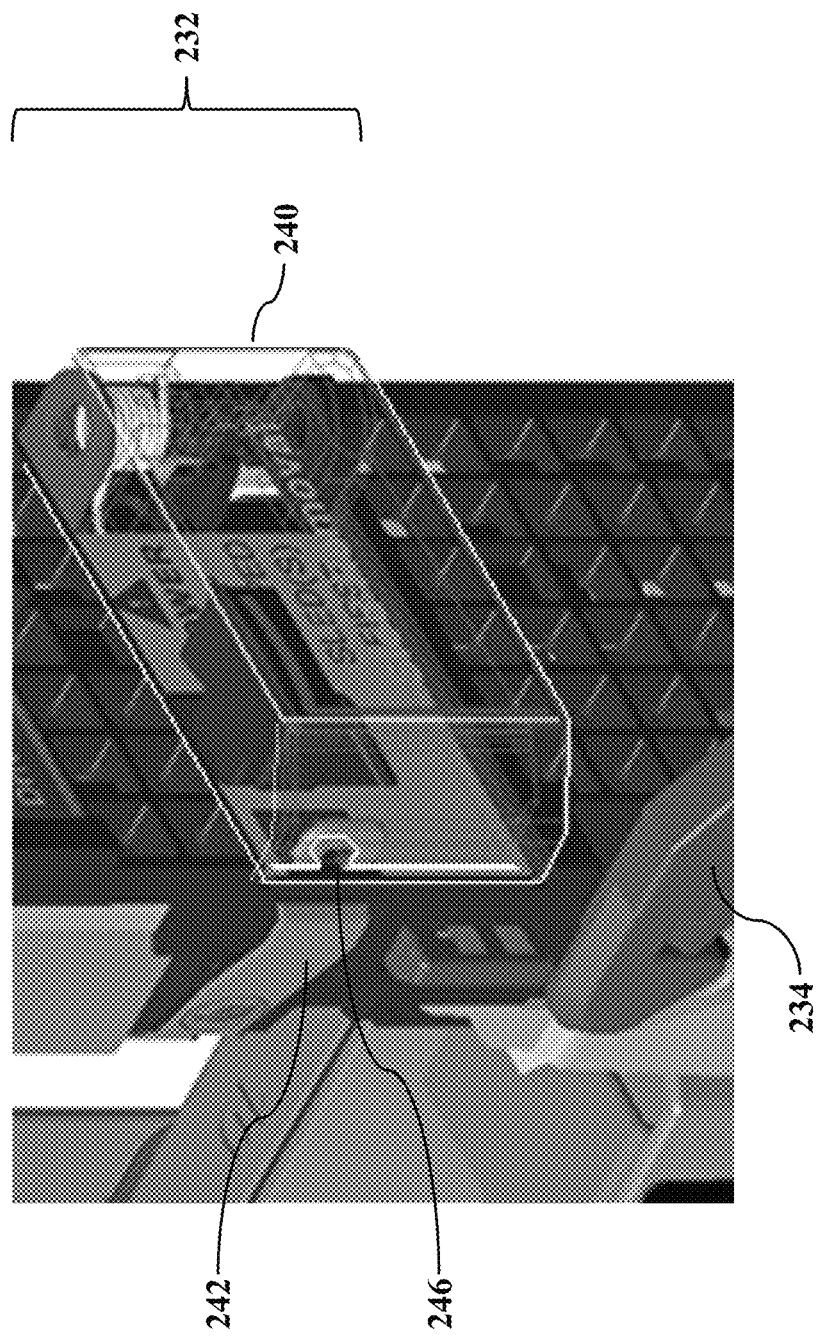
Figure 15:
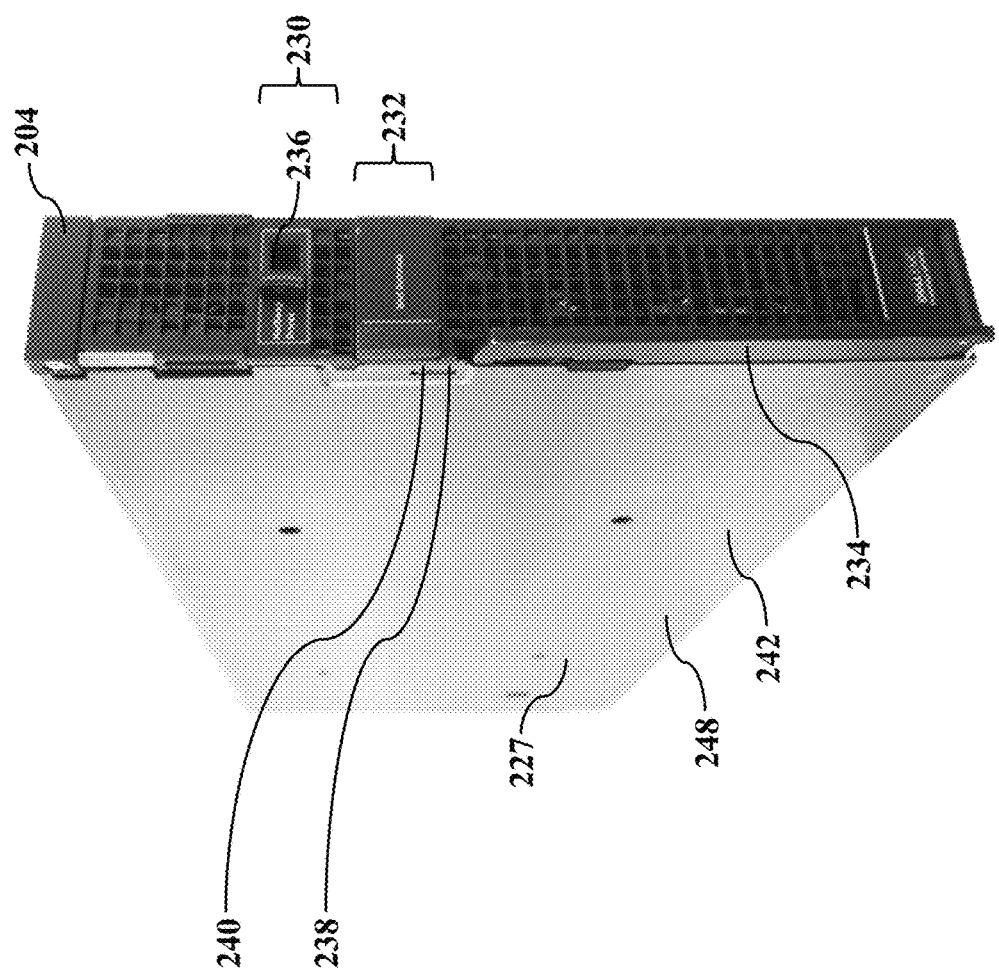
FIGS. 15-18 illustrate a cold swap task, according to exemplary embodiments.

As FIGS. 9-10 illustrate in greater detail, the hot swap mechanism 230 unlocks the outer sleeve 227. The release tab 236 is mechanically connected to a drawer lock 238, and the drawer lock 238 engages a mating notch or opening 240 in a side wall 242 of the outer sleeve 227. Because the release tab 236 is mechanically connected to the drawer lock 238, the release tab 236 and the drawer lock 238 move in directional unison. That is, when the user slides the release tab 236 rightward, the drawer lock 238 also slides rightward. When the user slides the release tab 236 leftward, the drawer lock 238 also slides leftward. To eject the sled 204 from the outer sleeve 227, the user simply slides the release tab 236 rightward, and the drawer lock 238 simultaneously moves with the release tab 236 in the same direction. As FIG. 10 illustrates, sufficient movement of the release tab 236 inwardly disengages mechanical interference of the drawer lock 238 with the side wall 238 of the outer sleeve 227. Indeed, as FIG. 10 also illustrates, sufficient movement of the release tab 236 retracts the drawer lock 238 (hidden from view). Because the drawer lock 238 is mechanically disengaged from the side wall 238, a spring mechanism (not shown) outwardly pushes the sled 204 from the outer sleeve 227.

Hot swappable drive replacement is the most conducted task. Sled installation or removal is only performed a few times in the product lifecycle. The hot swap mechanism 230 may thus visually highlight the area for hot swap task. The hot swap mechanism 230 ejects the sled 204 in a nearly effortless scheme. The hot swap mechanism 230 also reduces the visibility of cold swap sled removal.

FIGS. 11-14 show that the hot swap mechanism 230 simultaneously disables the cold swap mechanism 232. That is, when the hot swap mechanism 230 is manually engaged by the user, the cold swap mechanism 232 is nearly simultaneously disabled and mechanically disengaged to prevent ejecting the sled 204 from the outer sleeve 227 and cutting or disconnecting its power source. For example, when the drive drawer 222 is ejected, the sled handle 234 mechanically and temporarily loses its function to cam in or out of the outer sleeve 227. To prevent invalid action, a hinged protective cover 240 locks to prevent accessing the cold swap mechanism 232. When the release tab 236 is slid to mechanically release the drive drawer 222 (as above explained), the movement of the release tab 236 also mechanically restricts a spring latch 242 that retains the protective cover 240 in its closed position. The spring latch 242 prevents the protective cover 240 from swinging open to reveal a handle release mechanism 244 for the sled handle 234. Manual engagement of the hot swap mechanism 230, in other words, automatically and mechanically locks the spring latch 242, thus blocking the user's access to the handle release mechanism 244 to unlock the sled handle 234. The hot swap mechanism 230 thus locks the protective cover 240 to prevent the user from pivoting the sled handle 234 to eject the sled 204 from the outer sleeve 227. As FIGS. 13-14 best illustrate, when the drive sled 248 is ejected from the outer sleeve 227, the side wall 242 no longer pushes the spring latch 242 inwards. The spring latch 242 thus acts as a metal spring and swings outward to engage a hook 246 in the protective cover 240. Because the spring latch 242 retains and secures the protective cover 240 in its closed position, the user is unable to open the protective cover 240 and access the internal, hidden handle release mechanism 244.

Figure 16:
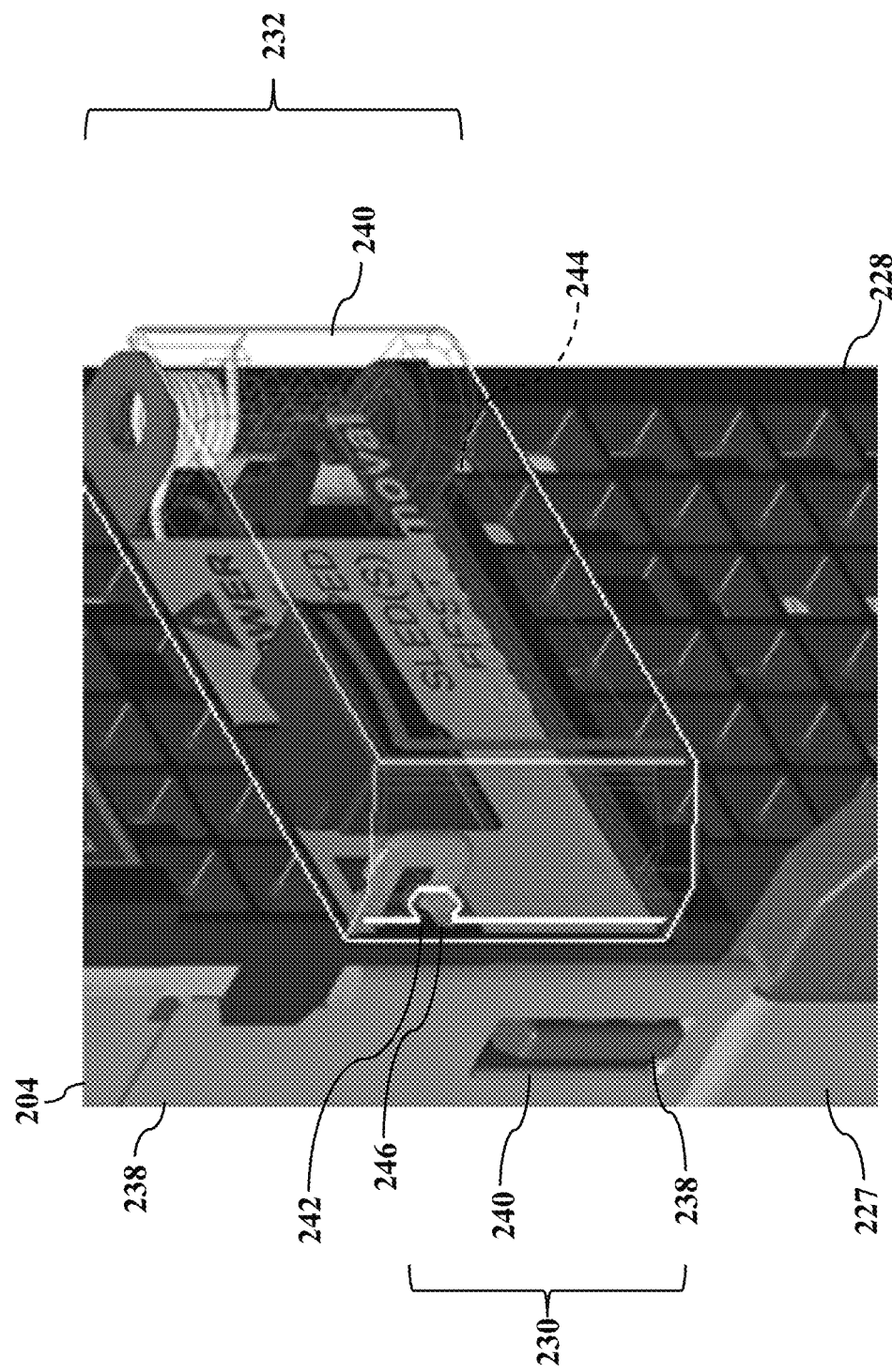
Figure 17:
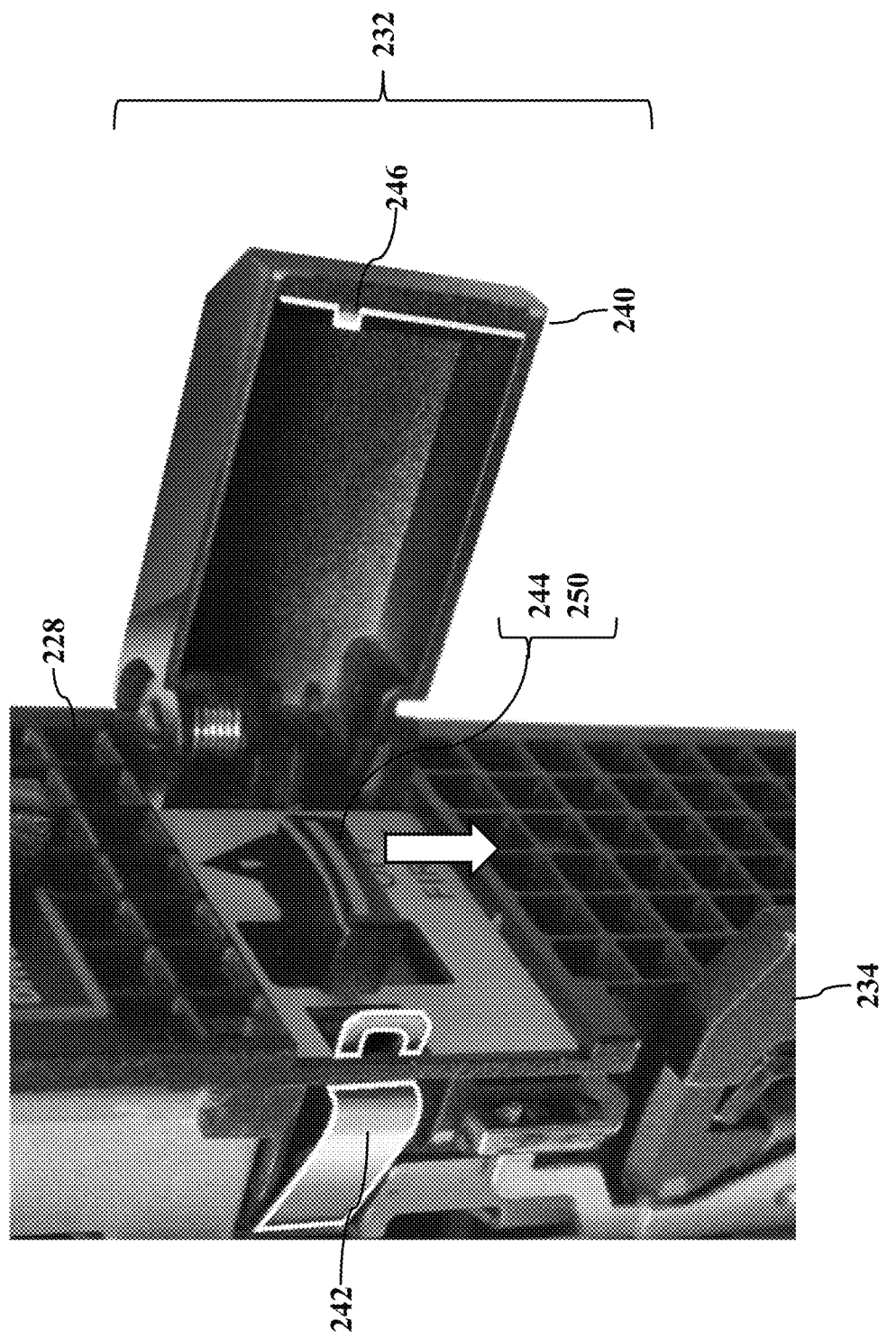
Figure 18:
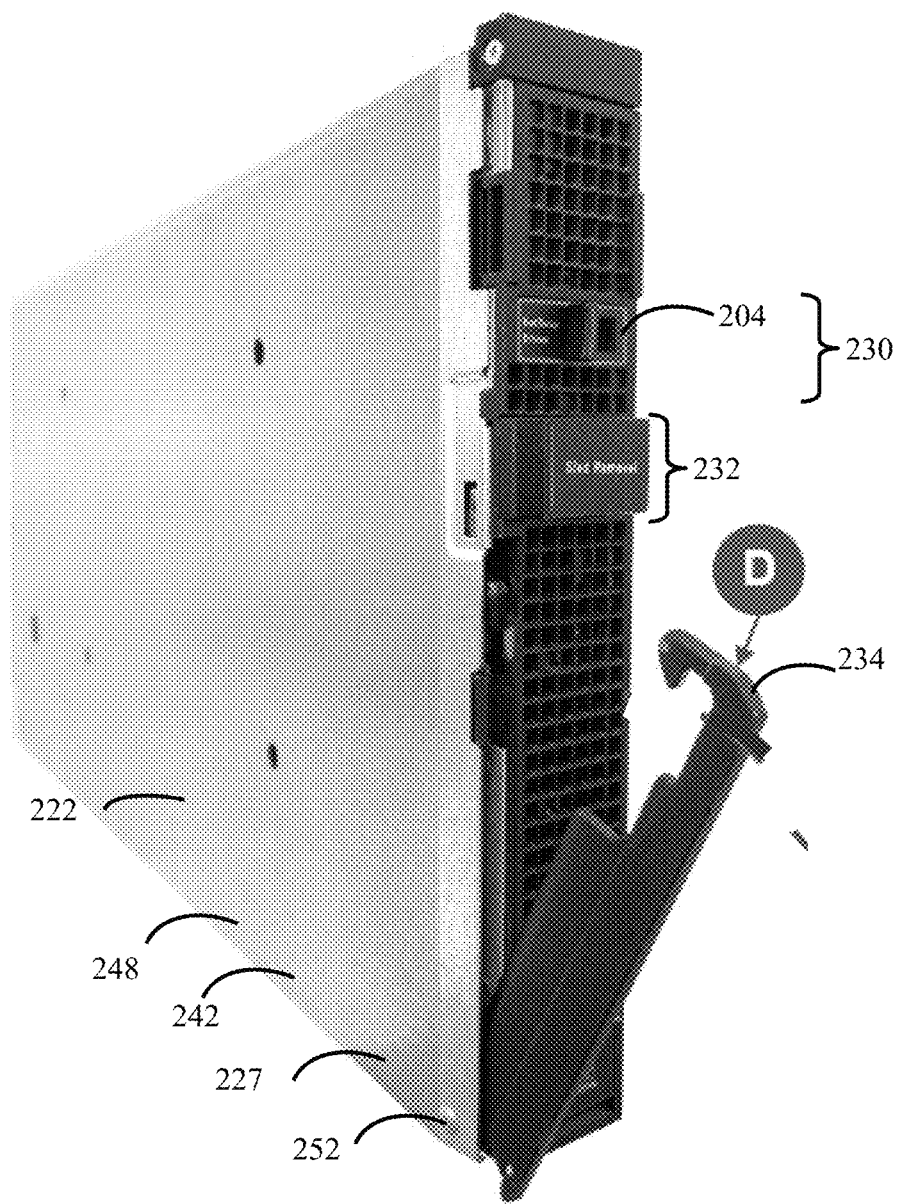

FIGS. 15-18 show that when the sled 204 is removed from the drive drawer 222, it is cut or disconnected from its power source. Before the drive sled 248 can be mechanically removed, the sled 204 must be fully inserted into the drive sled 248. When the sled 204 is fully inserted into the drive sled 248, the hot swap mechanism 230 engages the side wall 242 (such as the drawer lock 238 engages the mating notch or opening 240 in the side wall 242. As FIG. 16 shows, when the sled 204 is fully seated within the drive sled 248, the side wall 242 forces or pushes the spring latch 242 inwards. The spring latch 242 thus disengages the hook 246 in the protective cover 240. As FIG. 17 illustrates, because the protective cover 240 is spring hinged, the protective cover 240 unlocks and swings to its open position, thus revealing the handle release mechanism 244 that protrude through the front panel 228. Now that the protective cover 240 exposes the handle release mechanism 244, the user is able to move, depress, or slide another tab 250 that releases or mechanically unlocks the sled handle 234. As FIG. 18 illustrates, the user applies a force on the sled handle 234 to pivot it downward (about pivot point 252) to completely cam out the drive sled 248 from the drive drawer 222 and the outer sleeve 227. After the sled handle 234 is fully released, the drive sled 248 is ready for removal from infrastructure. The protective cover 240 thus blocks both direct visual and physical access to the tab 250. Moreover, once the protective cover 240 is open, a warning message may remind the user of a loss of electrical power and/or the correct procedure before removing the sled.

Figure 19:
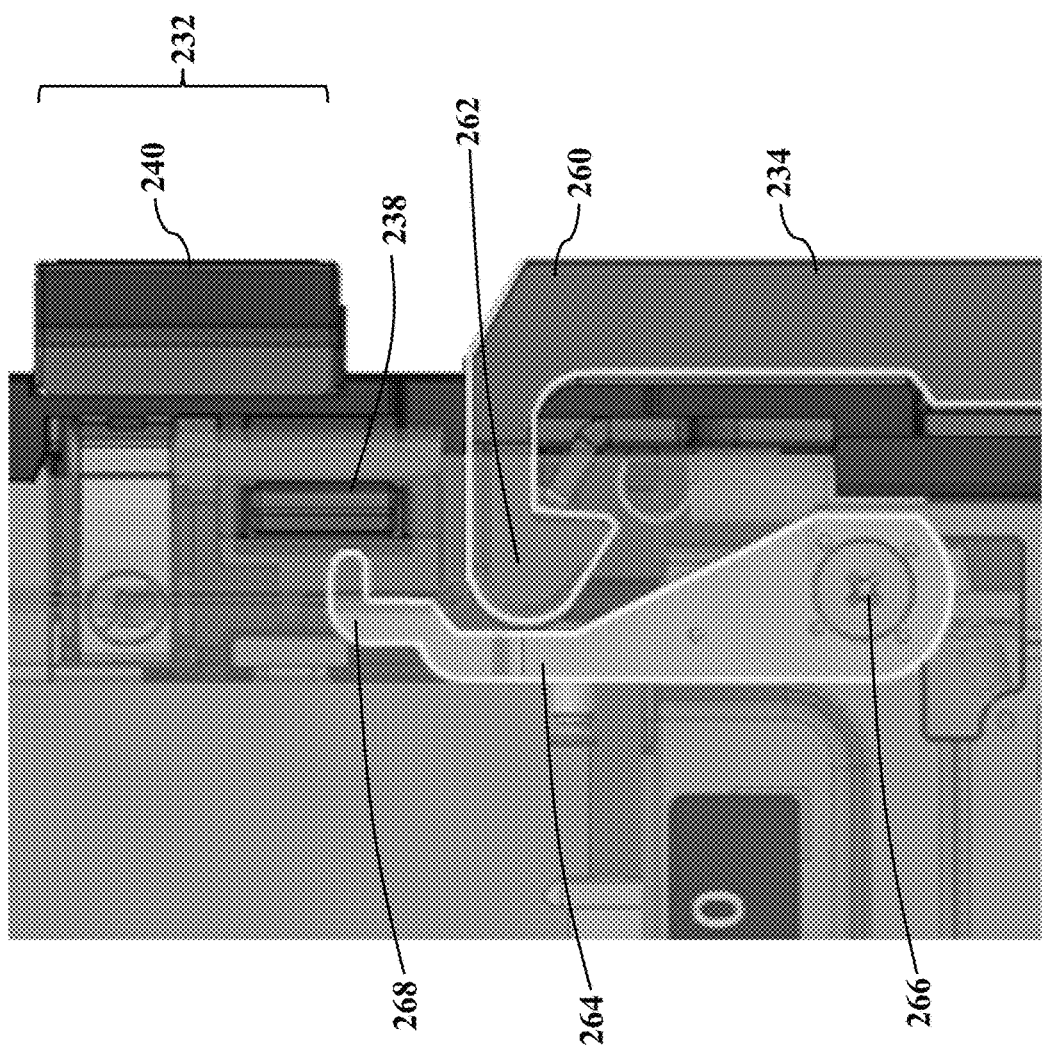
FIG. 19-20 illustrates a restrictive mechanical linkage, according to exemplary embodiments.
Figure 20:
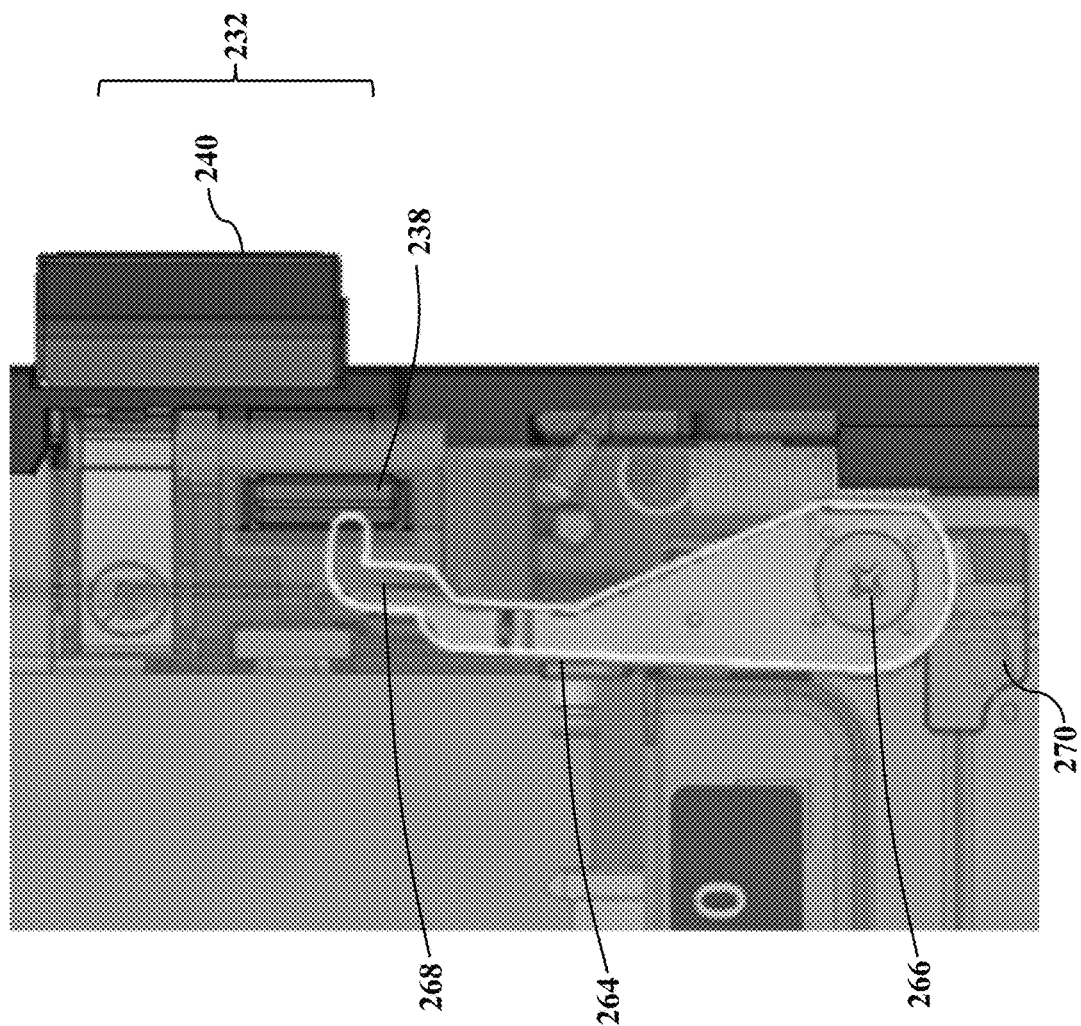

FIG. 19-20 illustrates a restrictive mechanical linkage, according to exemplary embodiments. When the sled handle 234 is fully released, the drive sled 248 may be removed (as illustrated with reference to FIGS. 15-18). However, to prevent the sled 204 from slipping out of the outer sleeve 227, the release tab 236 is automatically and mechanically disabled. As FIG. 19 illustrates, when the protective cover 240 is locked in its closed position and/or the sled handle 234 is seated in its upright, locked position, the drawer lock 238 of the hot swap mechanism 230 may be moved. An upper end 260 of the sled handle 234, for example, has a head 262 that contacts and pushes against a locking hook 264. The hook 264 pivots about a hinge 266, and a hook end 268 of the hook 264 is aligned to engage, hook, or insert into the drawer lock 238. So, when the sled handle 234 is seated in its upright, locked position, the head 262 of the sled handle 234 pushes against the hook end 268, thus counterclockwise pivoting the hook 264 away from the drawer lock 238. The sled handle 234 thus causes a mechanical clearance between the hook 264 and the drawer lock 238. The drawer lock 238 is thus unlocked, so the user may slide the drawer lock 238, as this disclosure above explains.

FIG. 20 illustrates a mechanical lock. When the sled handle 234 is pivoted down (and thus not illustrated in FIG. 20), the sled handle 234 no longer impinges or pushes against the hook end 268. An end of a return spring 270 connects to the hook 264, and the return spring 270 applies a return force to the hook 264, and the return force increases with the counterclockwise pivotable/rotational motion of the hook 264. When the sled handle 234 no longer impinges or pushes against the hook end 268, the return spring 270 forces the hook end 268 into mechanical interference with the drawer lock 238. The drawer lock 238 thus has an opening, slot, or passageway into which the hook end 268 inserts. When the hook 264 is disengaged with the drawer lock 238, the drawer lock 238 moves freely and simultaneously with the drawer release tab 236 (illustrated by FIGS. 6-9, 15 & 18). However, when the hook 264 engages the drawer lock 238, the drawer lock 238 cannot move and the sled 204 is locked into the outer sleeve 227. The release tab 236 is automatically and mechanically disabled and even immobilized to secure the sled 204 inside the outer sleeve 227, thus preventing accidental slipping out when transporting the chassis.

Exemplary embodiments thus present an elegant solution. The front panel 228 provides dual access to both the hot swap mechanism 230 and the cold swap mechanism 232. The swap mechanisms 230 and 232 are configured for dual tasking of both hot and cold swaps. Access via the front panel 228 overcomes the space limitation on the front bezel—both release mechanisms 230 and 232 are co-located at the same surface (the front panel 228), yet the front panel 228 access guides the user through the removal process correctly to prevent human errors and data/processing loss. Moreover, the customer experience is improved via a clear and straightforward design for different tasks. Eliminates the risk of data loss, invalid action and potential damage.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (such as random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of servicing a sled installed in an enclosure, comprising:
    ejecting the sled by engaging a front-protruding hot swap mechanism protruding through a front panel of the sled;
    when the front-protruding hot swap mechanism is engaged, mechanically disengaging a front-protruding cold swap mechanism protruding through the front panel of the sled to lock out access to the front-protruding cold swap mechanism;
    when the front-protruding cold swap mechanism is enabled, mechanically disengaging the front-protruding hot swap mechanism protruding through the front panel of the sled to block operation of the front-protruding hot swap mechanism; and
    sliding a release tab to disengage the front-protruding hot swap mechanism and retain a protective cover to prevent a user from pivoting a sled handle.

2. The method of claim 1, further comprising pivoting a mechanical linkage that connects the front-protruding hot swap mechanism to the front-protruding cold swap mechanism.

3. The method of claim 1, further comprising pivoting a mechanical linkage that engages the front-protruding hot swap mechanism and that mechanically disengages the front-protruding cold swap mechanism.

4. The method of claim 1, further comprising pivoting a mechanical linkage that disengages the front-protruding hot swap mechanism and that mechanically engages the front-protruding cold swap mechanism.

5. The method of claim 1, further comprising releasing the sled from a sled chassis.

6. The method of claim 1, further comprising ejecting the sled from the enclosure in response to the engaging of the front-protruding hot swap mechanism.

7. The method of claim 1, further comprising ejecting the sled from a drive drawer that slides within the enclosure.

8. An enclosure for sleds, the enclosure comprising:
    a front-protruding hot swap mechanism protruding through a front panel of the sled, the sled ejecting when the front-protruding hot swap mechanism is engaged;
    a front-protruding cold swap mechanism protruding through the front panel of the sled, the front-protruding cold swap mechanism mechanically linked to the front-protruding hot swap mechanism, the front-protruding cold swap mechanism disengaging in response to the engaging of the hot swap mechanism to lock out access to the front-protruding cold swap mechanism, wherein operation of the front-protruding hot swap mechanism is blocked in response to the engaging of the front-protruding cold swap mechanism; and
    a release tab when slid to disengage the front-protruding hot swap mechanism and to mechanically retain a protective cover to prevent a user from pivoting a sled handle.

9. The enclosure of claim 8, further comprising a mechanical linkage that pivots in response to the engaging of the hot swap mechanism and that mechanically connects the front-protruding hot swap mechanism to the front-protruding cold swap mechanism.

10. The enclosure of claim 8, further comprising a mechanical linkage that pivots in response to the engaging of the front-protruding hot swap mechanism to nearly simultaneously mechanically disengage the front-protruding cold swap mechanism.

11. The enclosure of claim 8, further comprising a mechanical linkage that pivots to disengage the front-protruding hot swap mechanism and to nearly simultaneously mechanically engage the front-protruding cold swap mechanism.

12. The enclosure of claim 8, wherein the front-protruding cold swap mechanism further comprises a lock that locks the sled to the enclosure.

13. The enclosure of claim 8, further comprising an ejection mechanism that ejects the sled in response to the engaging of the front-protruding hot swap mechanism.

14. The enclosure of claim 8, further comprising a drive drawer that slides within the enclosure.

15. A sled for installation in an enclosure, comprising:
    a release mechanism to lock or unlock a slider mechanism of the sled;
    a front-protruding hot swap mechanism protruding through a front panel of the sled, the hot swap mechanism engaging to eject the sled;
    a front-protruding cold swap mechanism protruding through the front panel of the sled, the front-protruding cold swap mechanism mechanically linked to the front-protruding hot swap mechanism, the front-protruding cold swap mechanism disengaging in response to the engaging of the front-protruding hot swap mechanism to lock out access to the front-protruding cold swap mechanism, wherein operation of the front-protruding hot swap mechanism is blocked in response to the engaging of the front-protruding cold swap mechanism; and
    a release tab when slid to disengage the front-protruding hot swap mechanism and to mechanically retain a protective cover to prevent a user from pivoting a sled handle.

16. The sled of claim 15, further comprising a mechanical linkage that pivots in response to the engaging of the front-protruding hot swap mechanism and that mechanically connects the hot swap mechanism to the front-protruding cold swap mechanism.

17. The sled of claim 15, further comprising a mechanical linkage that pivots in response to the engaging of the front-protruding hot swap mechanism to nearly simultaneously mechanically disengage the front-protruding cold swap mechanism.

18. The sled of claim 15, further comprising further comprising a mechanical linkage that pivots to disengage the front-protruding hot swap mechanism and to nearly simultaneously mechanically engage the front-protruding cold swap mechanism.

19. The sled of claim 15, further comprising an ejection mechanism that ejects the sled in response to the engaging of the front-protruding hot swap mechanism.

20. The sled of claim 15, further comprising a drive drawer.

* * * * *